(12) United States Patent
Kim

(10) Patent No.: US 8,283,774 B2
(45) Date of Patent: Oct. 9, 2012

(54) CHIP ON FILM TYPE SEMICONDUCTOR PACKAGE

(75) Inventor: Do-Young Kim, Chungcheongbuk-do (KR)

(73) Assignee: MagnaChip Semiconductor, Ltd., Chungcheongbuk-do (KR)

( * ) Notice: Subject to any disclaimer, the term of this patent is extended or adjusted under 35 U.S.C. 154(b) by 298 days.

(21) Appl. No.: 12/710,804

(22) Filed: Feb. 23, 2010

(65) Prior Publication Data

US 2011/0101513 A1  May 5, 2011

(30) Foreign Application Priority Data

Oct. 30, 2009 (KR) .................. 10-2009-0104653

(51) Int. Cl.
*H01L 23/36* (2006.01)
(52) U.S. Cl. ................. 257/706; 257/E23.112
(58) Field of Classification Search .............. 257/706, 257/712, 713, E23.101, E23.112
See application file for complete search history.

(56) References Cited

U.S. PATENT DOCUMENTS

| 5,221,575 A * | 6/1993 | Nakano et al. ................. 428/323 |
| 6,225,701 B1 * | 5/2001 | Hori et al. ..................... 257/783 |
| 6,956,288 B2 * | 10/2005 | Ueno et al. .................... 257/735 |
| 2004/0033643 A1 * | 2/2004 | Odegard et al. ............... 438/120 |

FOREIGN PATENT DOCUMENTS

| JP | 56161140 A * | 12/1981 |
| JP | 07-125137 | 5/1995 |
| JP | 2005-116668 | 4/2005 |
| KR | 10-0771890 | 10/2007 |
| KR | 10-2009-0110206 A | 10/2009 |

* cited by examiner

*Primary Examiner* — Wensing Kuo
(74) *Attorney, Agent, or Firm* — Morgan, Lewis & Bockius LLP

(57) ABSTRACT

A chip on film type semiconductor package includes a film, a plurality of leads formed over the film, a chip formed over the plurality of leads, an under-fill layer filled an space between the chip and the plurality of leads and an insulating heating sheet formed on an opposite side of the film contacting to the plurality of leads, wherein the insulating heating sheet is formed of a compound based on a glass fiber.

8 Claims, 2 Drawing Sheets

CHIP ON FILM TYPE SEMICONDUCTOR PACKAGE

CROSS-REFERENCE TO RELATED APPLICATIONS

The present application claims priority of Korean Patent Application No. 10-2009-0104653, filed on Oct. 30, 2009, which is incorporated herein by reference in its entirety.

BACKGROUND OF THE INVENTION

Exemplary embodiments of the present invention relate to a semiconductor package, and more particularly to a chip on film type semiconductor package.

As a low production cost and a high performance of a display device such as liquid crystal display (LCD) panel have been required, an integration rate of pixels of the display device has been increased.

Therefore, as a pitch of a driver IC chip for controlling each of the pixels in the display device has been minimized, semiconductor packages have been developed variously.

Semiconductor type packages such as a tape carrier package (TCP), a chip on glass (COG), and a chip on film (COF) are generally used to the display device.

Since the 1990's, the COF type semiconductor package has been mainly used to improve productivity and reduce production cost as a general semiconductor type package.

The COF type semiconductor package is a new semiconductor package for minimizing a driver IC chip of the display device.

As a driving frequency of TVs and monitors has increased from 60 Hz to 120 Hz, a driving load of the driver IC chip has been increased, thereby increasing heat of the driver IC chip. The increased heat is issued as a problem.

Korean Patent No. 10-0771890 discloses a method for addressing such a concern on the increasing heat of the driver IC chip.

FIG. 1 is a cross sectional view of a conventional COF type semiconductor package 100.

Referring to FIG. 1, the conventional COF type semiconductor package 100 includes a driver IC chip 103, a bump 106, a plurality of leads 102, an under-fill layer 107, a film 101, a heat pad 104 and an insulation tape 105.

The film 101 is flexible and coupled to the driver IC chip 103 through the plurality of leads 102 and the bump 106.

The plurality of leads 102 are formed over the film 101 separately from each other and one ends of the leads 102 are disposed to be concentrated in a central region.

In space between the driver IC chip 103 and the film 101, the under-fill layer 107 is filled to stably fix the driver IC chip 103 and the flexible film 101.

The heating pad 104 is formed over an opposite side of the film 101 contacting with the leads 102 by an adhesive member (not shown).

The heating pad 104 radiates a heat generated by operation of the driver IC chip 103 through the under-fill layer 107 and the leads 102. The heating pad 104 may include a metal material such as aluminum (Al).

As described above, since the conventional COF type semiconductor package 100 includes the heating pad 104 including the metal material, the conventional COF type semiconductor package 100 is inflexibility.

Furthermore, since the conventional COF type semiconductor package 100 includes the heating pad 104 including the metal material, the additional insulating tape 105 is essential for an insulation treatment of the heating pad 104. It is provided to inconvenient fabrication process of the COF type semiconductor package 100.

Also, since the heating pad 104 becomes less flexible, the leads 102 are easily broken as the heating pad 104 becomes thicker.

SUMMARY OF THE INVENTION

Embodiments of the present invention are directed to providing a method for fabricating a semiconductor memory device, which can decrease a production cost of the semiconductor memory device.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof In accordance with an embodiment of the present invention, a chip on film type semiconductor package includes: a film; a plurality of leads formed over the film; a chip formed over the plurality of leads; an under-fill layer filled an space between the chip and the plurality of leads; and an insulating heating sheet formed on an opposite side of the film contacting to the plurality of leads, wherein the insulating heating sheet is formed of a compound based a glass fiber.

The insulating heating sheet may have a form of a lattice structure.

The insulating heating sheet may have a stacked structure of silicon paste and the glass fiber.

The insulating heating sheet may include a compound including a silicon rubber, a boron nitride and the glass fiber.

A volume content of the silicon rubber may be in a range of approximately 19% to approximately 24%, a volume content of the boron nitride may be in a range of approximately 65% to approximately 71% and a volume content of the glass fiber may be less than approximately 10%.

A thickness of the insulating heating sheet may be in a range of approximately 100 μm to approximately 200 μm.

The insulating heating sheet may be attached to the film by an adhesive member.

The chip may include a driver IC chip.

The under-fill layer may include a liquid resin.

The insulating heating sheet may have a thermal resistance less than approximately 0.2° C./W.

DESCRIPTION OF SPECIFIC EMBODIMENT

Figure 1:
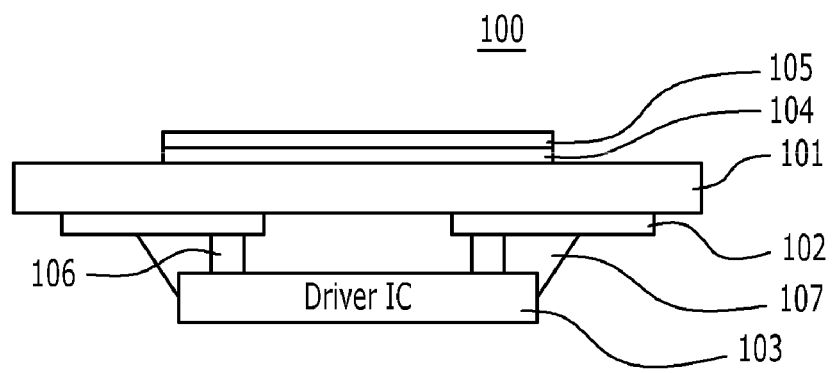
FIG. 1 is a cross sectional view illustrating the conventional chip on film (COF) type semiconductor package.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the prevent invention.

The drawings are not necessarily to scale and in some instances, proportions may have been exaggerated in order to clearly illustrate features of the embodiments. When a first layer is referred to as being "on" a second layer, it not only refers to a case where the first layer is formed directly on the second layer or the substrate, but also a case where a third layer exists between the first layer and the second layer.

Figure 2:
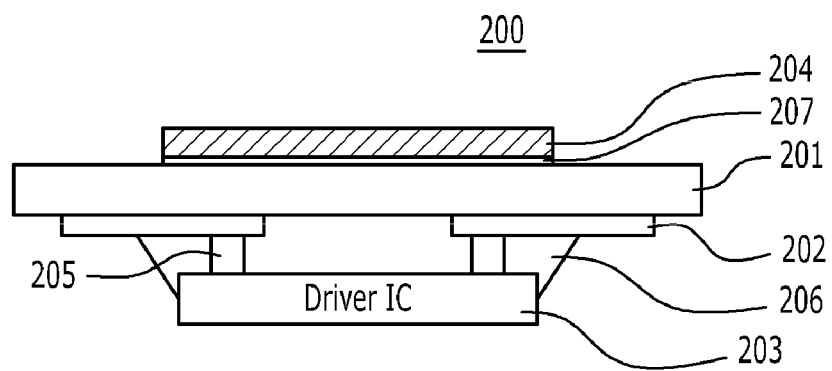
FIG. 2 is a cross sectional view illustrating a chip on film (COF) type semiconductor package in accordance with an embodiment of the present invention.
Figure 3A:
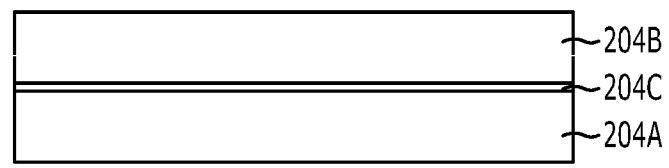
FIG. 3A is a cross sectional view illustrating a heating sheet shown in FIG. 2.
Figure 3B:
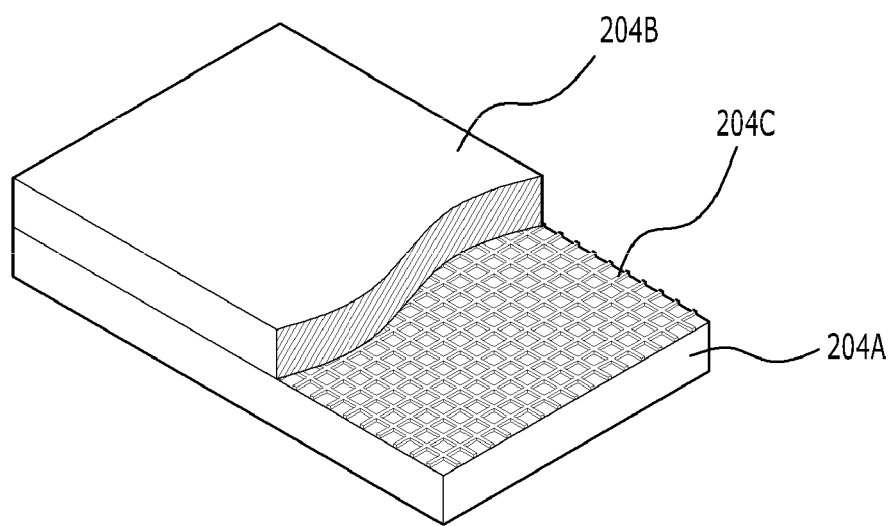
FIG. 3B is a detail view illustrating the heating sheet in FIG. 3A.

FIG. 2 is a cross sectional view illustrating a chip on film (COF) type semiconductor package 200 in accordance with an embodiment of the present invention. FIG. 3A is a cross sectional view illustrating a heating sheet. FIG. 3B is a detail view illustrating the heating sheet in FIG. 3A.

Referring to FIG. 2, the COF type semiconductor package 200 includes a driver IC chip 203, a bump 205, a plurality of leads 202, an under-fill layer 206, a film 201, an adhesive member 207 and an insulating heating sheet 204. The film 201 is flexible is coupled to the driver IC chip 203 through the plurality of leads 202 and the bump 205.

The plurality of leads 202 are formed beneath the film 201 separately from each other and one ends of the leads 202 are disposed to be concentrated in a central region.

In space between the driver IC chip 203 and the film 201, the under-fill layer 206 is filled to stably fix the driver IC chip 203 and the film 201.

The insulating heating sheet 204 is formed over the film 201 by the adhesive member 207.

The film 201 may include an insulation layer such as polyimide. The leads 202 may include a copper (Cu). The leads 202 and the driver IC chip 203 are coupled by the bump 205. The bump 205 may include a gold (Au). The under-fill layer 206 may include a liquid resin.

The adhesive member 207 may include a conductive material. The conductive material may include a material based on an acrylic.

The heating sheet 204 radiates a heat generated by an operation of the driver IC chip 203 to outside through the under-fill layer 206 and the leads 202.

The insulating heating sheet 204 includes a compound based a glass fiber, not a metal-based. For example, the insulating heating sheet 204 may include a stacked layer of a glass fiber layer, a layer based on a silicon paste and a glass fiber layer.

The insulating heating sheet 204 may include a compound including a silicon rubber, a boron nitride and a glass fiber. A volume content of the silicon rubber is in a range of approximately 19% to approximately 24%. A volume content of the boron nitride is in a range of approximately 65% to approximately 71%. A volume content of the glass fiber is less than approximately 10%.

As shown in FIG. 3A, the insulating heating sheet 204 may have a structure of a glass fiber 204C being inserted between two of silicon paste layers 204A and 204B for improving a thermal conductivity and reducing a thermal resistance.

As shown in FIG. 3B, the glass fiber 204C may have form of a lattice structure.

Furthermore, since the insulating heating sheet 204 including the silicon rubber, the boron nitride and the glass fiber has an insulating characteristic, an additional insulating tape 105 for an insulation treatment of the COF type semiconductor package 200 including the heating sheet 204 is not necessary. Accordingly, a production cost may be reduced.

A thickness of the insulating heating sheet 204 is in a range of approximately 100 µm to approximately 200 µm. A radiator effect of the COF type semiconductor package 200 including the heating sheet 204 becomes greater as the thickness of insulating heating sheet 204 becomes greater.

The insulating heating sheet 204 is flexible since the insulating heating sheet 204 includes the compound based on the glass fiber 204C having a flexibility. The insulating heating sheet 204 may be provided to laminate equipment in a roll type. That is, the laminate equipment laminates the insulating heating sheet 204 to the film 201 easily without a limitation on a design. On the contrary, the conventional heating pad 104 is not flexible since the conventional heating pad 104 includes the metal-based material such as the aluminum (Al).

For example, the COF type semiconductor package 200 including the heating sheet 204 may be used for a purposed of radiating heat of a component for a vehicle, a light emitting diode (LED) and a fluorescent lamp. The COF type semiconductor package 200 including the heating sheet 204 may be applied to various products, which do not include a film type heat sink such as a driver IC on which a heat sink cannot be mounted, a thermal controller, a central processing unit (CPU), a memory.

The insulating heating sheet 204 may be used as a heating sheet requiring an insulation in a flexible type-printed circuit board (PCB) or serve as a heat sink in a driver IC chip, a semiconductor device and a heating block.

Furthermore, since the insulating heating sheet 204 based on the glass fiber has a great tensile force, the COF type semiconductor package 200 including the heating sheet 204 may be applied to product requiring tensile force and flexibility.

A comparison result of the thermal conductivity and the thermal resistance between conventional heating pad 104 and the heating sheet 204 of the embodiment of the present invention is described in the following Table 1.

TABLE 1

|  | conventional heating pad 104 | insulating heating sheet 1 | insulating heating sheet 2 | insulating heating sheet 3 |
| --- | --- | --- | --- | --- |
| thickness | 110 µm | 200 µm | 200 µm | 200 µm |
| thermal conductivity | 4.5 W/mk | 5.0 W/mk | 4.1 W/mk | 3.9 W/mk |
| thermal resistance | 0.25° C./W | 0.12° C./W | 0.18° C./W | 0.19° C./W |

Referring to the Table 1, the insulating heating sheet 1 is BFG20A, the insulating heating sheet 2 is BFG20 and the insulating heating sheet 3 is B520. The BFG20A, the BFG20 and the BS20 are item names of a manufacturer named of NISSO SHO JI Corporation.

Shown as the Table 1, the insulating heating sheets 1, 2 and 3 have a thermal conductivity similar to a thermal conductivity of the conventional heating pad 104, i.e., approximately 4.5 W/mk. The insulating heating sheets 1, 2 and 3 have a thermal resistance less than that of the conventional heating pad 104, i.e., approximately 0.2° C./W.

Furthermore, since the flexibility of the heating sheet 204 is greater and a price of the heating sheet 204 is lower than that of the conventional heating pad 104, the COF type semiconductor package 200 including the heating sheet 204 is widely applied to the various products.

As described above, in accordance with an embodiment of the present invention, since the insulation treatment of the COF type semiconductor package including the heating sheet is not necessary, the production cost may be decreased. The COF type semiconductor package including the flexible heating sheet may be applied to various products.

Furthermore, since the insulating heating sheet based the glass fiber has a great tensile force, the COF type semiconductor package including the heating sheet may be applied to product requiring tensile force and flexibility.

Furthermore, since the insulating heating sheet provides a spread effect which buffers a temperature gap between the film and the based the driver IC chip, suppresses a contraction and expansion to thereby prevent the leads from being broken.

While the present invention has been described with respect to the specific embodiments, it will be apparent to those skilled in the art that various changes and modifications may be made without departing from the spirit and scope of the invention as defined in the following claims.

What is claimed is:

1. A chip on film type semiconductor package, comprising:
    a film;
    a plurality of leads formed beneath the film; a chip coupled to one ends of the leads;
    an under-fill layer filled between the chip and the plurality of leads; and
    an insulating heating sheet formed on over the film and comprising a glass fiber inserted between silicon paste layers, wherein the insulating heating sheet has a thermal resistance less than approximately 0.2° C/W.

2. The chip on film type semiconductor package of claim 1, wherein the insulating heating sheet has a form of a lattice structure.

3. The chip on film type semiconductor package of claim 1, wherein the insulating heating sheet includes a compound including a silicon rubber, a boron nitride and the glass fiber.

4. The chip on film type semiconductor package of claim 3, wherein a volume content of the silicon rubber is in a range of approximately 19% to approximately 24%, a volume content of the boron nitride is in a range of approximately 65% to approximately 71% and a volume content of the glass fiber is less than approximately 10%.

5. The chip on film type semiconductor package of claim 1, wherein the insulating heating sheet has a thickness in a range of approximately 100 μm to approximately 200 μm.

6. The chip on film type semiconductor package of claim 1, wherein the insulating heating sheet is attached to the film by an adhesive member.

7. The chip on film type semiconductor package of claim 1, wherein the chip includes a driver IC chip.

8. The chip on film type semiconductor package of claim 1, wherein the under-fill layer includes a liquid resin.

* * * * *